United States Patent
Sakai et al.

(10) Patent No.: US 7,446,423 B2
(45) Date of Patent: Nov. 4, 2008

(54) SEMICONDUCTOR DEVICE AND METHOD FOR ASSEMBLING THE SAME

(75) Inventors: Tadahiko Sakai, Fukuoka (JP); Mitsuru Ozono, Fukuoka (JP); Yoshiyuki Wada, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 402 days.

(21) Appl. No.: 10/509,025

(22) PCT Filed: Apr. 14, 2003

(86) PCT No.: PCT/JP03/04693

§ 371 (c)(1),
(2), (4) Date: Sep. 27, 2004

(87) PCT Pub. No.: WO03/088355

PCT Pub. Date: Oct. 23, 2003

(65) Prior Publication Data

US 2005/0116323 A1    Jun. 2, 2005

(30) Foreign Application Priority Data

Apr. 17, 2002  (JP) .............. 2002-114538
Apr. 17, 2002  (JP) .............. 2002-114539

(51) Int. Cl.
*H01L 23/48* (2006.01)
*H01L 21/44* (2006.01)

(52) U.S. Cl. .............. 257/783; 257/787; 257/E23.133; 438/959; 438/118; 438/127

(58) Field of Classification Search ........... 257/758, 257/701, 687, 670, 783, 787, E23.133; 136/256, 136/251; 174/261; 438/959, 118, 127
See application file for complete search history.

(56) References Cited

U.S. PATENT DOCUMENTS

| 4,301,464 | A | * | 11/1981 | Otsuki et al. ............. 257/670 |
| 5,844,309 | A | * | 12/1998 | Takigawa et al. .......... 257/701 |
| 5,942,048 | A | * | 8/1999 | Fujisaki et al. ............. 136/256 |
| 6,023,096 | A | * | 2/2000 | Hotta et al. ............... 257/687 |
| 6,064,114 | A |   | 5/2000 | Higgins, III |
| 6,175,075 | B1 | * | 1/2001 | Shiotsuka et al. .......... 136/251 |
| 6,300,576 | B1 | * | 10/2001 | Nakamura et al. ......... 174/261 |

(Continued)

FOREIGN PATENT DOCUMENTS

JP   2-192195   7/1990

(Continued)

*Primary Examiner*—Nitin Parekh
(74) *Attorney, Agent, or Firm*—Wenderoth, Lind & Ponack, L.L.P.

(57) ABSTRACT

In a semiconductor device provided with a thinned semiconductor element, the present invention intends to inhibit damage of the semiconductor element in the neighborhood of its outer periphery so as to improve reliability. A plurality of external connection terminals are formed on a front surface of the thinned semiconductor element. A plate higher in rigidity than the semiconductor element is adhered with a resin binder to a rear surface of the semiconductor element. An outer shape of the plate is made larger than that of the semiconductor element, and the resin binder covers a side face of the semiconductor element to form a reinforcement portion for reinforcing a periphery of the semiconductor element.

19 Claims, 11 Drawing Sheets

U.S. PATENT DOCUMENTS

| | | | |
|---|---|---|---|
| 6,617,655 B1 | 9/2003 | Estacio et al. | |
| 6,656,765 B1 * | 12/2003 | DiCaprio | 438/106 |
| 6,717,279 B2 * | 4/2004 | Koike | 257/787 |
| 6,797,544 B2 | 9/2004 | Sakai et al. | |
| 6,958,544 B2 * | 10/2005 | Sunohara | 257/758 |

FOREIGN PATENT DOCUMENTS

| | | |
|---|---|---|
| JP | 8-31872 | 2/1996 |
| JP | 10-135386 | 5/1998 |
| JP | 10-284634 | 10/1998 |
| JP | 11-126856 | 5/1999 |
| JP | 11-251360 | 9/1999 |
| JP | 2001-203298 | 7/2001 |
| JP | 2002-134641 | 5/2002 |
| JP | 2002-141439 | 5/2002 |

* cited by examiner

SEMICONDUCTOR DEVICE AND METHOD FOR ASSEMBLING THE SAME

TECHNICAL FIELD

The present invention relates to a highly reliable semiconductor device and an assembling method thereof.

BACKGROUND ART

As a structure for mounting a semiconductor device that is made of a packaged semiconductor element on a circuit board, a structure in which a projected electrode such as a solder bump formed on a semiconductor device is bonded to a base plate is known. In a semiconductor device having such a structure, an attempt to make a semiconductor device as thin as possible, that is, 150 μm or less is in progress. This intends, by reducing stress during the heat cycle, to realize high bonding reliability after the mounting. That is, when an environment temperature varies after the mounting, owing to differences in thermal expansion coefficients of a semiconductor and a workpiece, at a bonding portion of the semiconductor element and a solder bump, stress is generated. Making the semiconductor element thinner is intended to reduce the stress.

A mounting structure that is formed of such a thinned semiconductor element will be explained with reference to the drawings. FIG. 11A is a sectional view of an existing mounting structure and FIG. 11B is a diagram showing a deformed state of a semiconductor device in the existing mounting structure. In FIG. 11A, on base plate 10, semiconductor device 1 is mounted, and to electrode 10a formed on a top surface of base plate 10, bump 3 that is disposed on a circuit formation surface of semiconductor element 2 with solder as a formation material is bonded. Semiconductor element 2, as mentioned above, is made thinner with an intention of minimizing the stress generated at a bonding portion of the semiconductor element and the bump.

FIG. 11B shows a state where in a mounting structure in which semiconductor device 1 having such thinned semiconductor element 2 is mounted on base plate 10, thermal contraction stress is generated in reflowed base plate 10. Since semiconductor element 2 is thin and flexible, in accordance with the contraction deformation of base plate 10, semiconductor element 2 deforms accordingly. In a mounting structure where after forwarding the thinned semiconductor element 2 having a thickness of 150 μm or less is used, the deflection deformation of semiconductor element 2 shows a deflection shape (part shown with an arrow mark P1) in which semiconductor element 2 is concave between respective bumps 3; that is, as the thinning goes further, the improved traceability can be realized. It is demonstrated that thereby, a level of the stress generated at a bonding portion of semiconductor element 2 and bump 3 can be effectively reduced.

However, in a mounting structure made of thinned semiconductor element 2, disadvantages described below are confirmed empirically and according to numerical analysis. As shown in FIG. 11B, the deflection of semiconductor element 2 (shown with an arrow mark P2) rapidly increases outside bump 3 at the outermost periphery. Accordingly, in some cases, there is caused a phenomenon in that in the area outside of outermost periphery bump 3, a crack is generated on a bottom surface of semiconductor element 2, and semiconductor element 2 is broken due to the crack. That is, there is a problem in that as the semiconductor element is made thinner, while the stress generated in the solder bump is lowered, the neighborhood of the outer periphery of the semiconductor element is locally broken.

DISCLOSURE OF THE INVENTION

The present invention intends to provide a semiconductor device including a thinned semiconductor element, wherein a semiconductor element is inhibited from being broken in the neighborhood of an outer periphery portion, so as to improve the reliability.

In order to realize the above object, a semiconductor device according to the present invention is a semiconductor device in which, on a rear surface of a semiconductor element on a front surface of which a plurality of external connection terminals is formed, an integrated body higher in rigidity than the semiconductor element is adhered with a resin binder, wherein an outer shape of the integrated body is made larger than that of the semiconductor element and a side face of the semiconductor element is covered with resin binder to reinforce a periphery of the semiconductor element.

DETAILED DESCRIPTION OF THE INVENTION

Embodiment 1

Figure 1A:
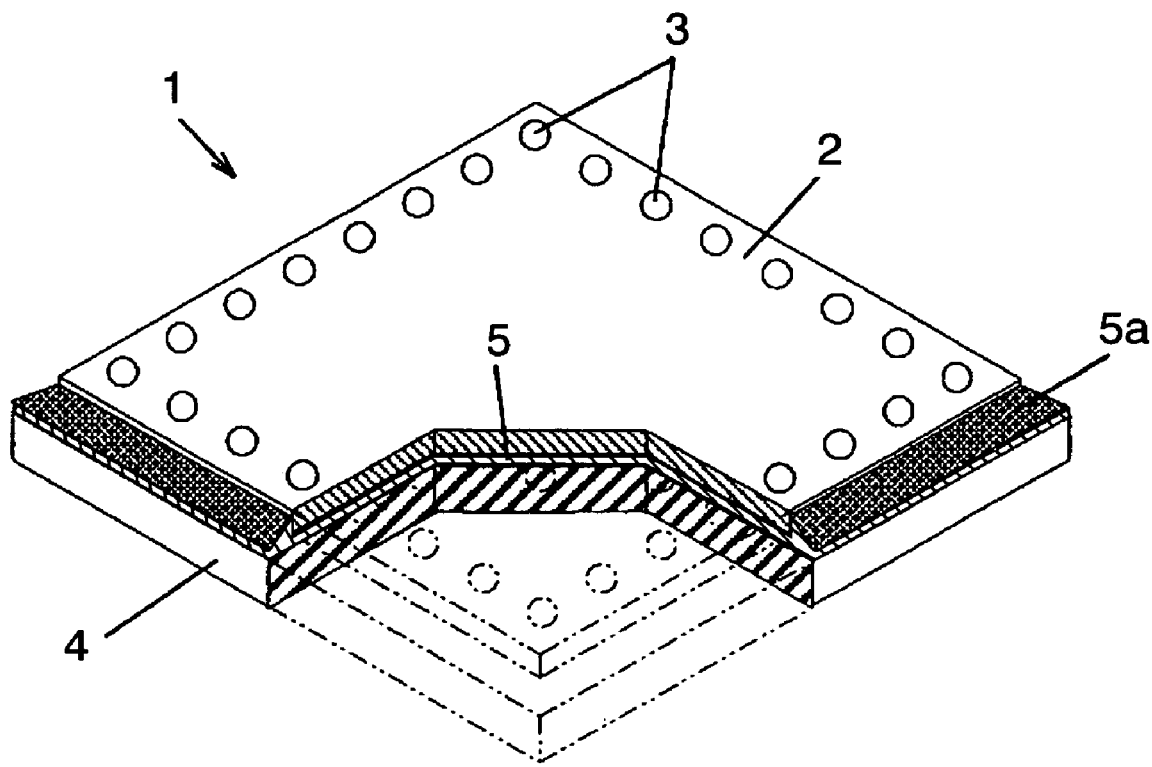
FIG. 1A is a perspective view of a semiconductor device according to embodiment 1 of the present invention.
Figure 1B:
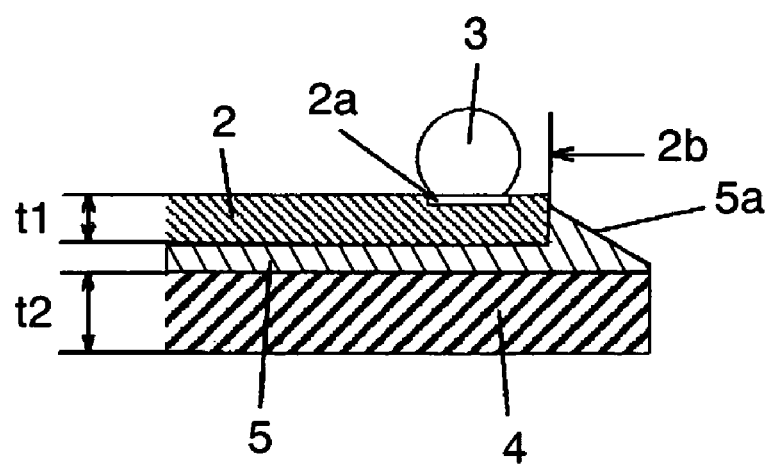
FIG. 1B is a partial sectional view of the semiconductor device according to embodiment 1 of the invention.

With reference to FIGS. 1A and 1B, a semiconductor device will be explained. In FIGS. 1A and 1B, semiconductor device 1 has a configuration in which on a rear surface (that is, second surface) of semiconductor element 2 plate 4 (integrated body) is adhered with resin binder 5 and, on a plurality of electrodes 2a that are external connection terminals formed along a periphery of a surface (that is, first surface) of semiconductor element 2, bumps 3 are formed.

Semiconductor element 2 here is in a state thinned by a method such as mechanical polishing or etching. In general, in a state where a semiconductor element is mounted on a base plate through bumps, the smaller a thickness of the semiconductor element is, the more excellent the reliability of the bonding after mounting is. This is because even when owing to difference of stresses of semiconductor element 2 and a base plate the stresses try to concentrate at a bonding portion of bump 3, owing to generation of deformation (deflection) in a thickness direction of semiconductor element 2 itself, the stress is dispersed. Accordingly, in the present embodiment, as mentioned above, semiconductor element 2 is thinned so as to have a thickness t1 in the range of 10 to 150 μm, and thereby semiconductor element 2 is allowed to deform (deflect) in a thickness direction.

In the thinning, a surface opposite to a circuit formation surface (first surface) of semiconductor element 2 is roughly processed by means of mechanical polishing with a grinding stone or the like followed by applying a finishing process by means of dry etching or wet etching with a chemical. When the mechanical polishing is applied, on a rear surface a damaged layer including many micro-cracks is formed. The damaged layer causes a decrease in the flexural strength of the semiconductor element. However, when the damaged layer is removed by the finishing, the flexural strength of semiconductor element 2 can be increased.

Plate 4 makes it easy to stably hold semiconductor device 1 during handling such as during the mounting of semiconductor device 1, and plate 4 has a function of protecting semiconductor device 1 that is mounted on a base plate or the like from an external force. Accordingly, plate 4 is formed of a structural material such as metal, ceramics or resin processed into a shape that satisfies the above function, that is, a thickness t2 having rigidity higher than semiconductor element 2 and an external shape larger than an external shape of semiconductor element 2.

For resin binder 5 that adheres semiconductor element 2 with plate 4, a material that has low elastic coefficient and is deformable is used. Thereby, while semiconductor element 2 is allowed to deform by a necessary amount in a thickness direction, semiconductor element 2 can be adhered to plate 4. That is, in a state where semiconductor device 1 is mounted on a base plate, semiconductor element 2 can deform following the deformation of the base plate.

As shown in FIG. 1, resin binder 5 is formed to protrude out of an edge of element 2 over an entire circumference of semiconductor element 2. Protruded resin binder 5a creeps up along side face 2b of semiconductor element 2 to form a shape that at least partially covers side face 2b. It is not necessarily required to cover an entire surface in a thickness direction of side face 2b; however, an edge on a side of plate 4 is covered. The edge on a side of plate 4 is formed with a second surface of semiconductor device 1 and side face 2b. Thus, resin binder 5a that covers side face 2b works as a reinforcement that reinforces a periphery of semiconductor element 2.

Figure 7A:
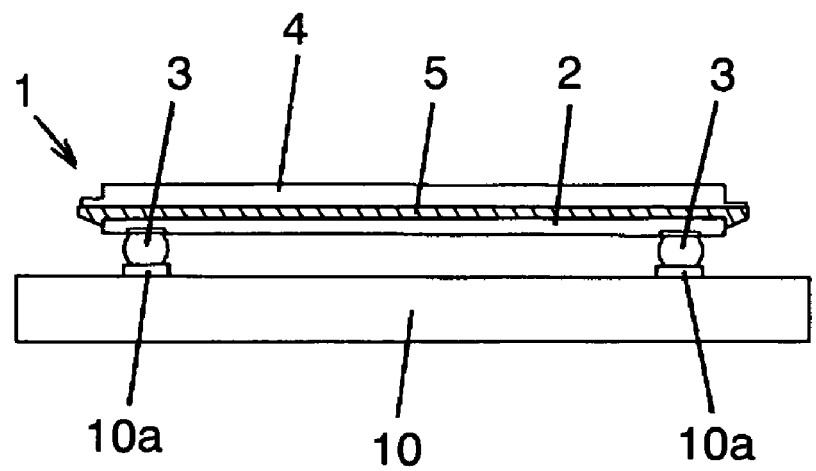
FIG. 7A is a sectional view of a mounting structure according to embodiment 1 of the invention.
Figure 7B:
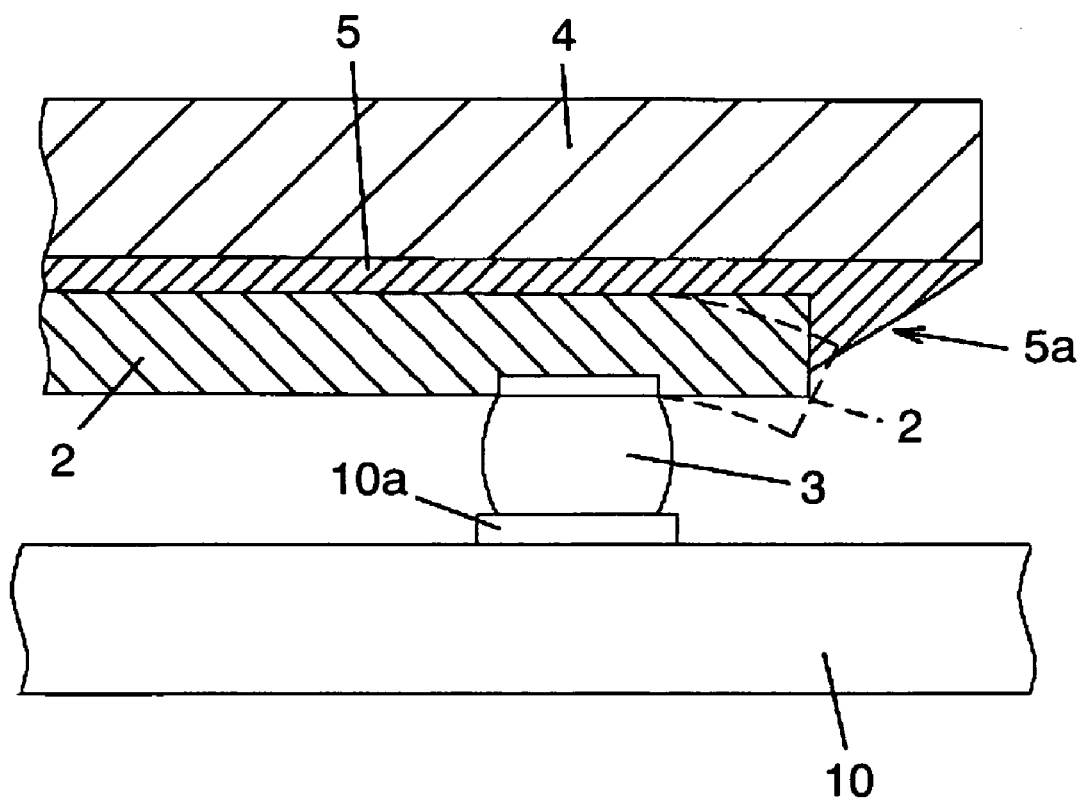
FIG. 7B is a partial sectional view of the mounting structure according to embodiment 1 of the invention.

At a periphery portion of semiconductor element 2, a fine crack generated when a semiconductor wafer is diced and individual semiconductor elements 2 are cut out is likely to remain as it is, and in some cases damage is generated from this crack. Resin binder 5a that covers side face 2b has an effect of reinforcing a periphery portion containing such fine crack. Furthermore, as mentioned below, in a state where semiconductor device 1 is mounted on base plate 10, it has a function of inhibiting semiconductor element 2 from excessively deforming owing to stress generated by a difference in thermal deformations of base plate 10 and semiconductor element 2 (FIGS. 7A and 7B).

Next, with reference to FIGS. 2A through 2E, a method of assembling semiconductor device 1 will be explained.

Figure 2A:
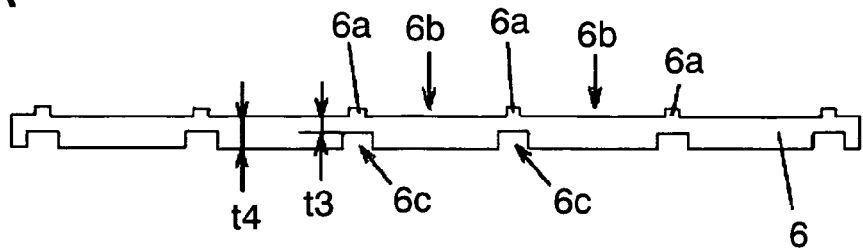
FIGS. 2A through 2E are diagrams for explaining steps of an assembling method of the semiconductor device according to embodiment 1 of the invention.
Figure 3:
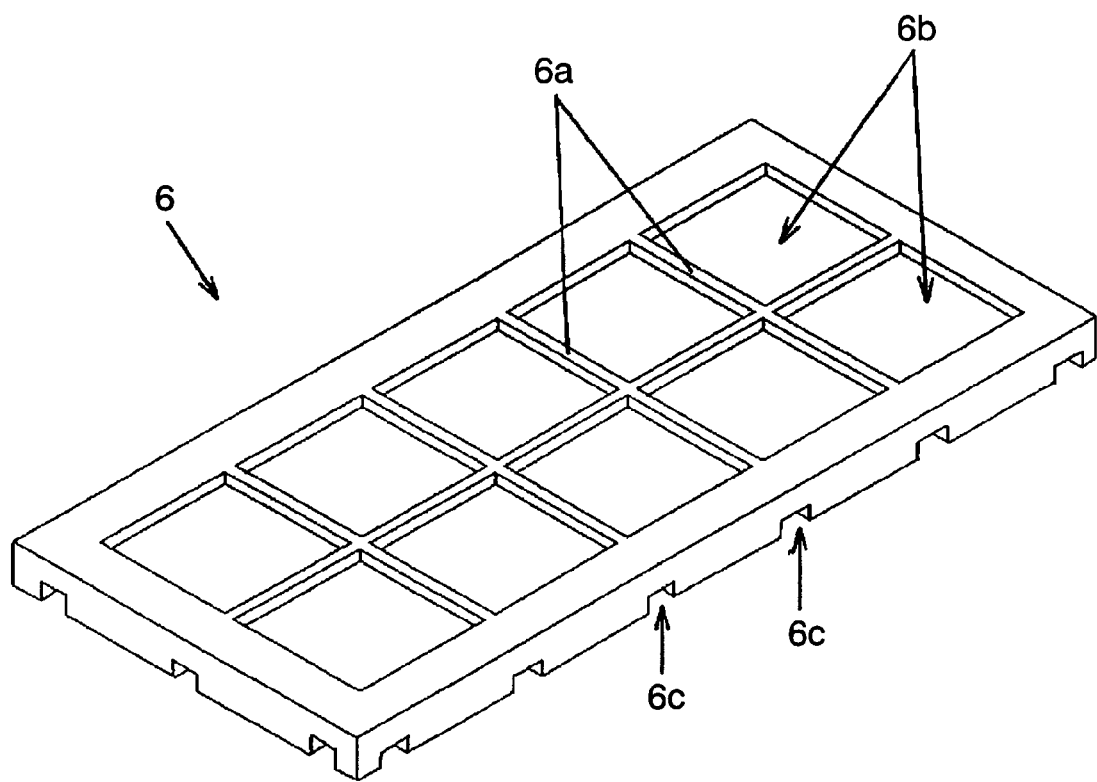
FIG. 3 is a perspective view of a plate member that is used in the semiconductor device according to embodiment 1 of the invention.

In FIG. 2A, plate member 6 is an intermediate component before plates 4 that each constitute part of a semiconductor device 1 are cut off. As shown in FIG. 3, on a top surface of plate member 6, raised partitions 6a protruded in lattice are disposed, and each of recess portions 6b surrounded by raised partitions 6a is a semiconductor element adhesion region to which semiconductor element 2 is adhered. Each of raised partitions 6a has a function as a dam that inhibits resin binder 5 from overflowing the semiconductor adhesion region and spreading into the surrounding, when, as mentioned below, resin binder 5 for adhering semiconductor element 2 is coated in recess portion 6b.

Groove portions 6c are formed on a bottom surface of plate member 6 at positions corresponding to raised partitions 6a. Groove portions 6c are formed by cutting grooves in a lattice pattern from a bottom surface side of plate member 6 that has a thickness t4, thereby forming thin-wall portions having thickness t3 smaller than t4. The thin-wall portions coincide with cutting places for separating each plate 4 from plate member 6.

Figure 2B:
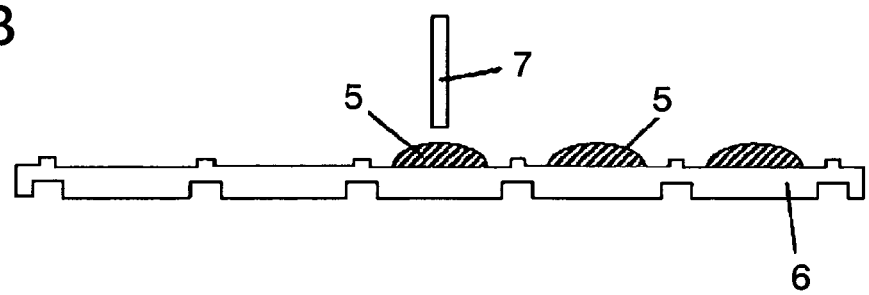

Next, as shown in FIG. 2B, into respective recess portions 6b of plate member 6 dispenser 7 supplies resin binder 5 for adhering semiconductor element 2 (first+ step). Due to the disposition of raised partitions 6a as dam portions surrounding recess portions 6b, resin binder 5 can be inhibited from overflowing the semiconductor adhesion region and spreading into the surroundings when being coated.

Furthermore, during the coating, dispenser 7 is controlled so as to discharge an appropriate coating amount of resin binder 5 necessary for covering side face 2b of semiconductor element 2 when resin binder 5 that is pressed down by semiconductor element 2 after the coating protrudes from an edge portion of semiconductor element 2.

Figure 2C:
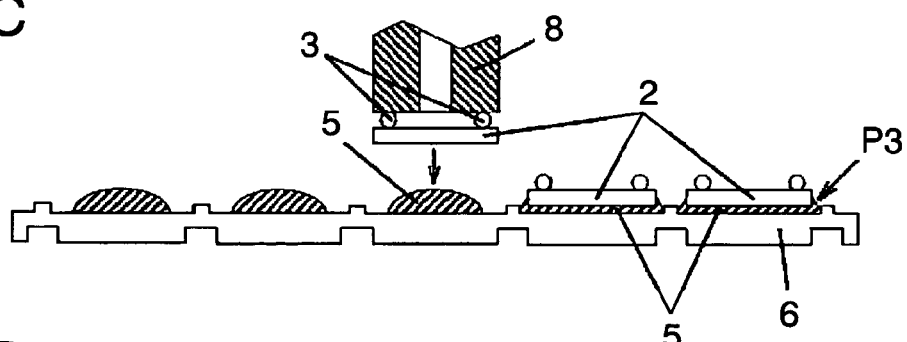
Figure 2D:
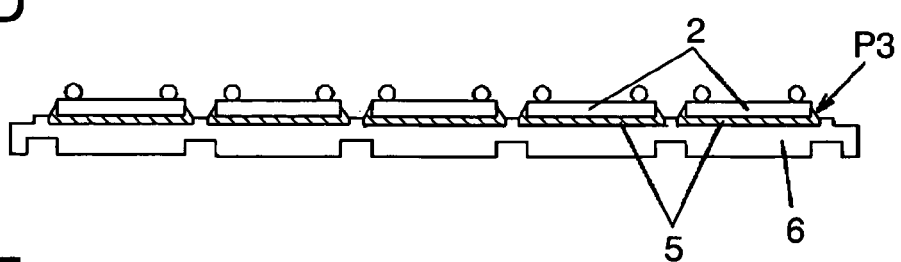

Thereafter, plate member 6 to which resin binder 5 is supplied is transferred to a second step for adhering a semiconductor element. In the second step, as shown in FIGS. 2C and 2D, the semiconductor elements 2 are each mounted on resin binder 5 that is coated on the plate member 6 (mounting step), followed by heating resin binder 5 (heating step) to cure resin binder 5, and thereby rear surface sides of a plurality of semiconductor elements 2 are adhered to respective recesses 6b of plate member 6 in an arranged manner with resin binder 5.

Figure 4:
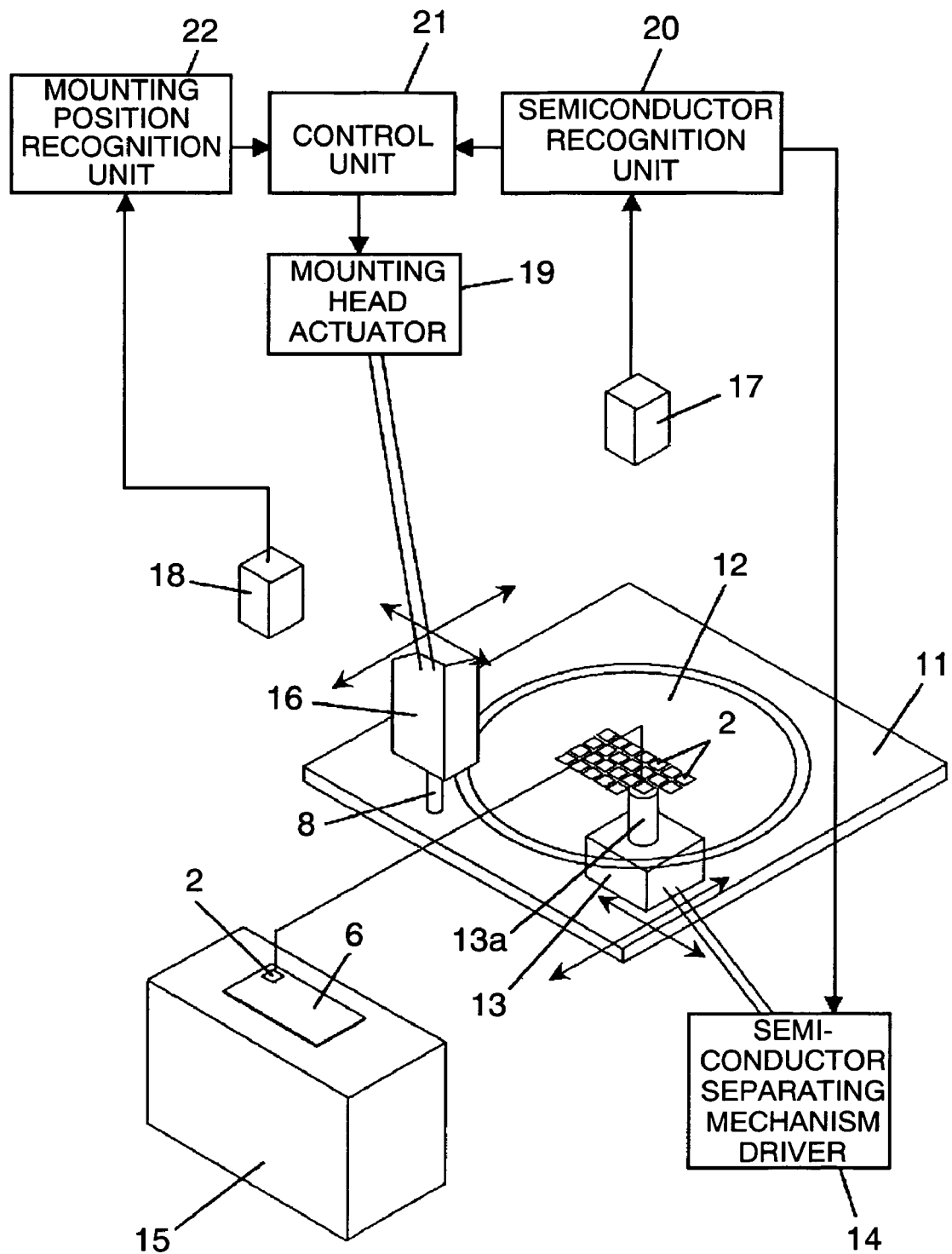
FIG. 4 is a perspective view of an electronic component mounting device that is used in assembling the semiconductor device according to embodiment 1 of the invention.

An electronic component mounting apparatus that is used for mounting semiconductor elements 2 in the mounting step will be explained with reference to FIG. 4. In FIG. 4, on supply table 11, adhesive sheet 12 to which semiconductor elements 2 are adhered in a lattice pattern is mounted. Below supply table 11, semiconductor separating mechanism 13 is disposed. When semiconductor separating mechanism 13 is driven by use of semiconductor separating mechanism driver 14, ejector pin unit 13a pushes up a bottom surface of adhesive sheet 12. Thereby, semiconductor element 2 is peeled off a top surface of adhesive sheet 12 and picked up by means of mounting head 16.

Base plate holder 15 is disposed on a lateral side of supply table 11, and plate member 6, having resin binder 5 thereon, is held on base plate holder 15. Above supply table 11 and base plate holder 15, mounting head 16 that is driven by means of mounting head actuator 19 is disposed. Mounting head 16 is provided with suction nozzle 8, picks up semiconductor element 2 from adhesive sheet 12 and mounts semiconductor element 2 on plate member 6 disposed on base plate holder 15.

Camera 17 placed above supply table 11 takes an image of semiconductor element 2 adhered to adhesive sheet 12. An image taken with camera 17 undergoes recognition processing at semiconductor recognition unit 20 to recognize a position of semiconductor element 2 in adhesive sheet 12. A result of position recognition is sent to control unit 21 and as well to semiconductor separating mechanism driver 14. Control unit 21, based on the result of the position recognition, controls mounting head actuator 19, and thereby, when mounting head 16 picks up semiconductor element 2, suction nozzle 8 and ejector pin unit 13a are aligned with semiconductor element 2.

Camera 18 disposed above base plate holder 15 takes an image of plate member 6 held by base plate holder 15. An image taken with camera 18 undergoes recognition processing at mounting position recognition unit 22 to detect a semiconductor element mounting position in plate member 6. A result of position recognition is sent to control unit 21. Control unit 21, based on the result of position recognition, controls mounting head actuator 19, and thereby, when mounting head 16 mounts semiconductor element 2, semiconductor element 2 held by suction nozzle 8 is aligned with a detected mounting position.

When semiconductor element 2 is mounted on plate member 6 by use of the electronic component mounting apparatus, as shown in FIG. 2C, a front surface (first surface) side on which bump 3 of semiconductor element 2 is formed is sucked and held by means of suction nozzle 8, and a rear surface (second surface) of semiconductor element 2 is pushed down on resin binder 5. At this time, in accordance with an amount of resin binder 5 coated, a pressing height due to suction nozzle 8 is controlled, and thereby resin binder 5 protruded outside of a periphery portion (portion shown with an arrow mark P3) of respective semiconductor elements 2 is made so as to creep up side face 2b of semiconductor element 2 and cover side face 2b (resin binder portion 5a shown in FIG. 1B). At this time, as long as an edge portion of the rear surface side of semiconductor element 2, where damage tends to occur due to dicing, is completely covered and reinforced, side face 2b may be completely covered or partially covered.

According to the embodiment, since semiconductor elements 2 are piece by piece pressed on resin binder 5 by use of mounting head 16 and mounted, the mounting load (pressing force) can be made smaller than that in the case of mounting (adhering) in a lump. Accordingly, as the electronic component mounting apparatus, a die bonder, a chip mounter and so on can be diverted.

Plate member 6 on which semiconductor elements 2 are thus mounted is transferred to a heating furnace. Heating at a predetermined temperature here cures resin binder 5 as shown in FIG. 2D. At this time, resin binder 5 protruded outside of a periphery portion of respective semiconductor elements 2, in the course of curing, temporarily becomes low in viscosity, thereby further creeping up side face 2b of semiconductor elements 2, followed by curing in this shape with side face 2b covered. Thereby, after curing of resin binder 5, resin binder 5a as a reinforcement shown in FIG. 1B is formed. Thereby, the second step is completed.

In the embodiment, after semiconductor elements 2 are mounted, plate member 6 is transferred to the heating furnace to cure resin binder 5; however, by use of mounting head 16 that incorporates heating means, semiconductor elements 2 may be heated while mounting.

That is, by use of the heating means incorporated in mounting head 16, suction nozzle 8 that holds semiconductor elements 2 may be heated and heat may be transferred through suction nozzle 8 and semiconductor elements 2 to heat resin binder 5. Furthermore, a heating coil or the like wired from mounting head 16 may be disposed in the surroundings of suction nozzle 8 to directly heat suction nozzle 8. That is, when the mounting means made of the mounting head 16 and the suction nozzle 8 are provided with heating means, mounting step and heating step can be simultaneously carried out.

In the case of heating being carried out with mounting head 16, the dedicated heating step shown in FIG. 2D may be omitted, and thus, there is an advantage that the apparatus can be simplified by omitting the heating furnace. However, in this case, since a tact time of mounting head 16 is restricted by a curing time, total productivity is lower than that in a case where the mounting step and the heating step are separately performed. Furthermore, in the embodiment, a thermosetting resin is used as an example of a resin binder 5. However, instead of this, a thermoplastic resin may be used.

Figure 2E:
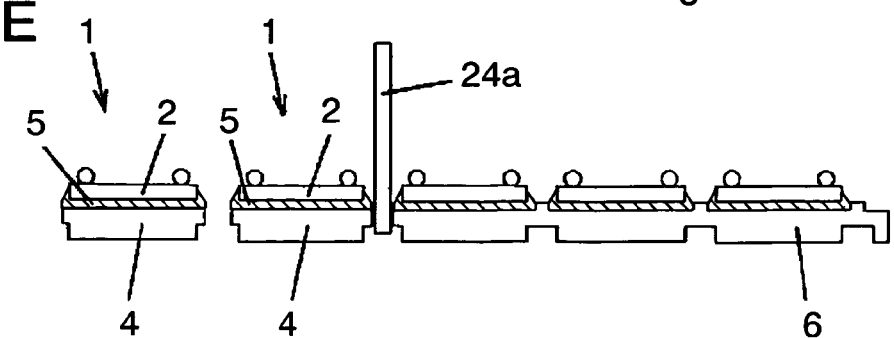

Plate member 6 where resin binder 5 is cured is thus transferred to a cutting step, and, as shown in FIG. 2E, plate member 6 to which semiconductor elements 2 are adhered is cut at cutting positions between adjacent semiconductor elements 2 by use of cutting blade 24a (third step). Thereby, plate member 6 is cut and separated into plates 4 for individual semiconductor elements 2, and thereby assembly of semiconductor devices 1 is completed.

Figure 5:
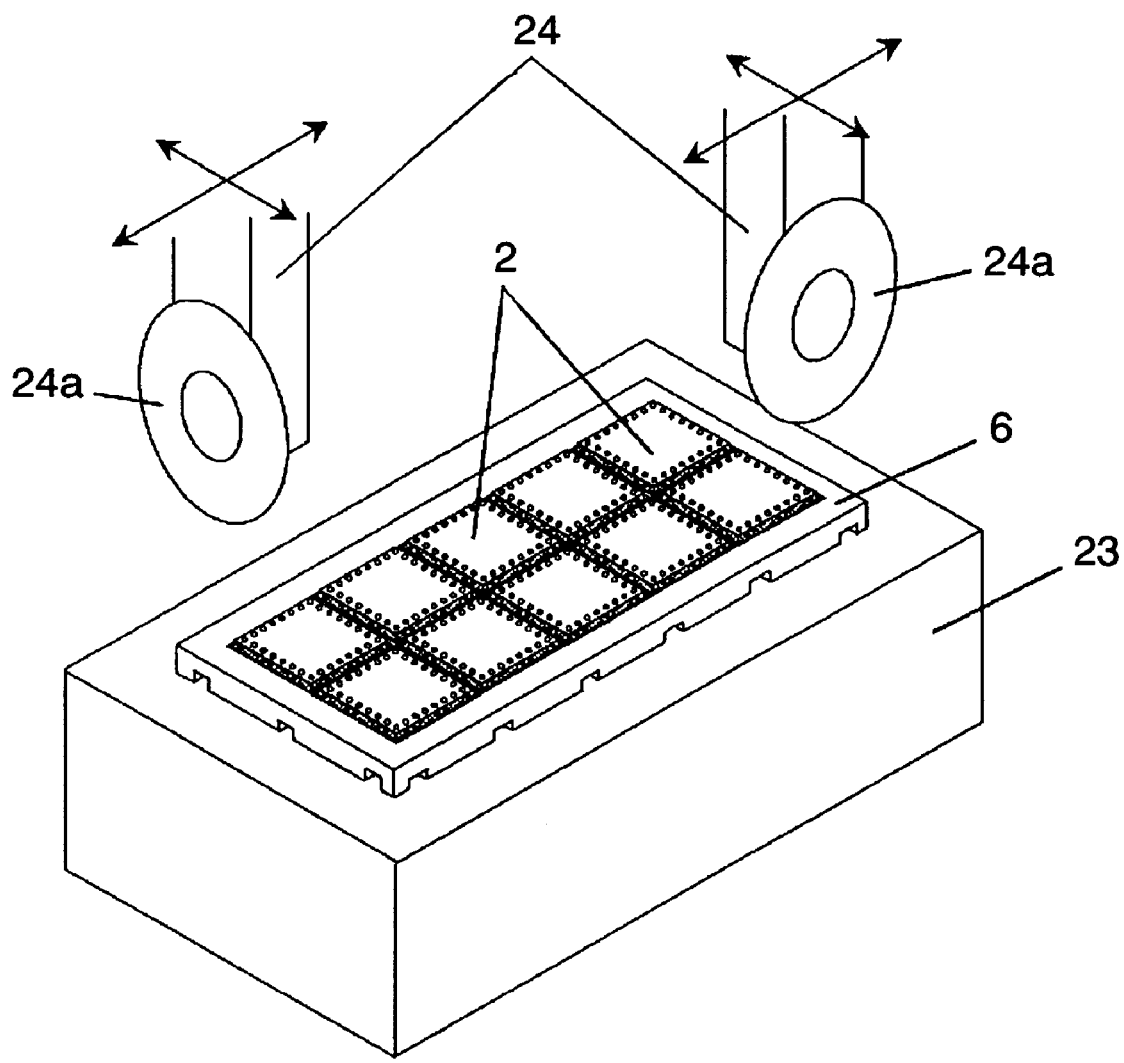
FIG. 5 is a perspective view of a dicing machine that is used in assembling the semiconductor device according to embodiment 1 of the invention.

The cutting step will be explained with reference to FIGS. 5 and 6. FIG. 5 shows a dicing machine that is used in the cutting. On a top surface of plate fixing table 23, plate member 6 on which semiconductor elements 2 are mounted followed by curing resin is disposed. Above the plate fixing table 23, cutting head 24 with cutting blade 24a is disposed, and, by moving cutting head 24 in an X-direction or a Y-direction with cutting blade 24a rotating, plate member 6 is cut along cutting positions in accordance with grooves 6c.

Figure 6:
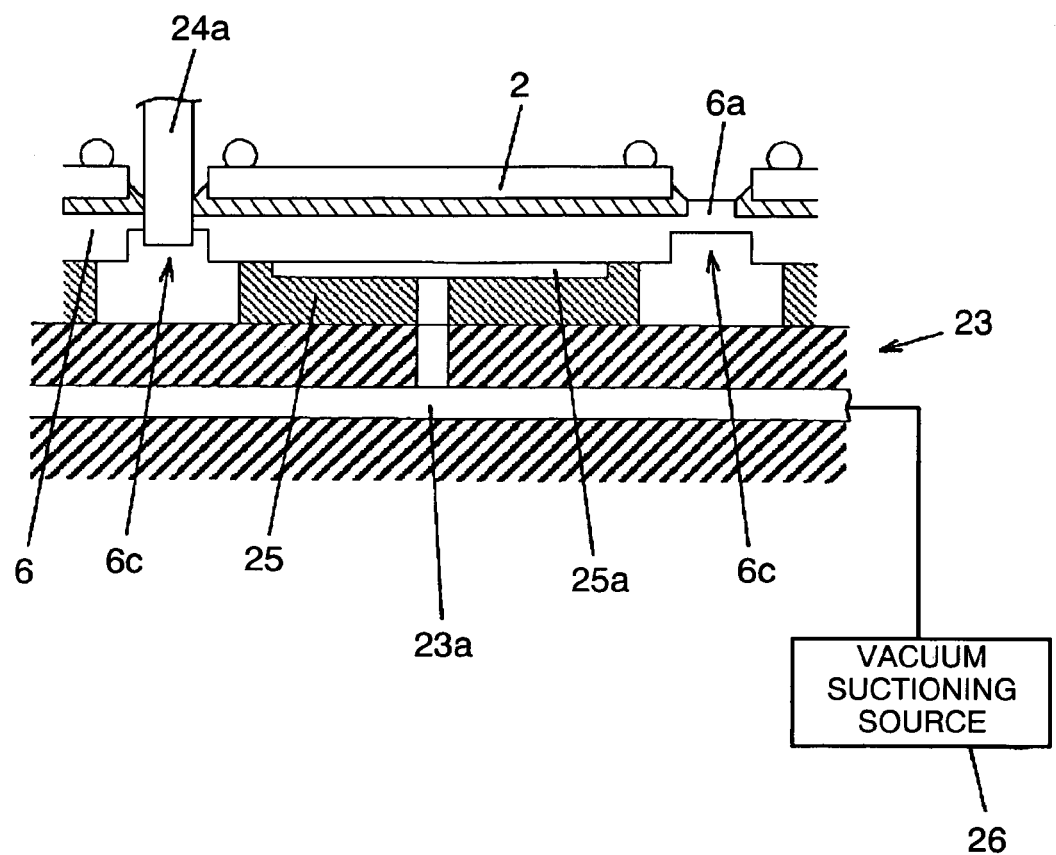
FIG. 6 is a partial sectional view of the dicing machine that is used in assembling the semiconductor device according to embodiment 1 of the invention.

As shown in FIG. 6, suction retainers 25 are disposed on a top surface of the plate fixing table 23 at positions corresponding to semiconductor elements 2 on plate member 6, and suctioning groove 25a is formed on a top surface of each suctioning retainer 25. Suctioning grooves 25a are communicated with suctioning hole 23a disposed inside of plate fixing table 23, and suctioning hole 23a is further connected to vacuum suctioning source 26. When vacuum suctioning source 26 is driven with a bottom surface of plate member 6 abutted on suctioning retainers 25, plate member 6 is sucked and retained with suctioning retainers 25, and thereby a position of plate member 6 is fixed.

With plate member 6 thus fixed in position, cutting blade 24a is aligned on each raised partition 6a of the plate member 6, and when cutting blade 24a is lowered while rotating, a thin wall portion of groove 6c is cut. At this time, by use of cutting blade 24a having a width smaller than a separation between adjacent semiconductor elements 2, plate member 6 is cut with a shape such that, after separation into individual pieces, each plate 4 extends beyond an end surface of the corresponding semiconductor element 2. Accordingly, in individually separated semiconductor devices 1, an external shape of plate 4 becomes larger than that of semiconductor element 2.

Furthermore, at the cutting, since grooves 6c are formed beforehand on a bottom surface, a thickness of a portion that is cut with cutting blade 24a is made smaller. Thereby, since a necessary lowering amount of cutting blade 24a in the cutting step can be made as small as possible, when the cutting blade is lowered, a tip end of the blade can be inhibited from coming into contact with plate fixing table 23 to cause damage.

In the next place, an electronic component mounting structure that is formed by mounting the above semiconductor device 1 on a base plate will be explained with reference to FIGS. 7A and 7B.

As shown in FIG. 7A, semiconductor device 1 is mounted on base plate 10 when bump 3 is solder bonded and connected to electrode 10a formed on a top surface of base plate 10. FIG. 7B shows a deformed state of semiconductor element 2 located outside of bump 3. In a structure where semiconductor element 2 that is thinned as shown in the embodiment is bonded through bump 3 to base plate 10, because of the stress generated owing to difference of thermal deformations of semiconductor element 2 and base plate 10, a portion of semiconductor element 2 outside of bump 3 tends to deflect largely toward base plate 10. A deflected state is shown with a dotted line in FIG. 7B. Owing to the deformation, in the neighborhood of the outside of bump 3, on a bottom surface of semiconductor element 2 large surface stress is generated, and thereby, in some cases, semiconductor element 2 is damaged.

By contrast, as shown in the embodiment, in the case of semiconductor device 1 reinforced with resin binder 5a that covers side face 2b of semiconductor element 2 being mounted on base plate 10, downward deflection of semiconductor element 2 in an area outside of bump 3 at an outermost periphery can be largely diminished. That is, resin binder 5a covers side face 2b of semiconductor element 2 and works so as to inhibit semiconductor element 2 from excessively deflecting. By this operation, semiconductor element 2 is inhibited from deflecting downward, and thereby semiconductor element 2 can be inhibited from being damaged owing to the deflection thereof.

Figure 8A:
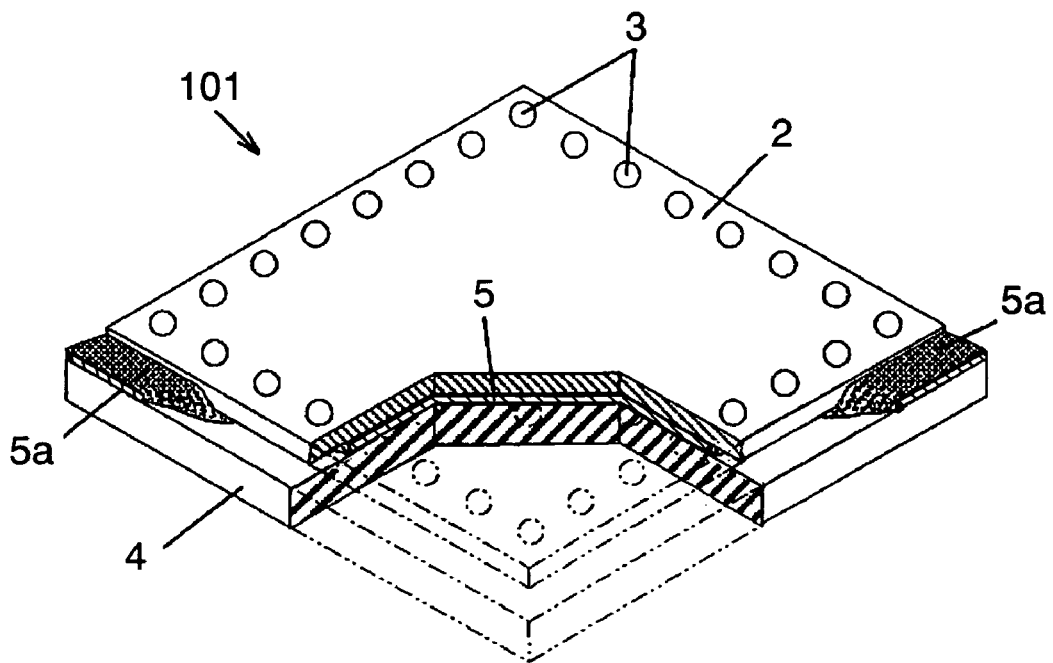
FIG. 8A is a perspective view of the semiconductor device according to embodiment 1 of the invention.
Figure 8B:
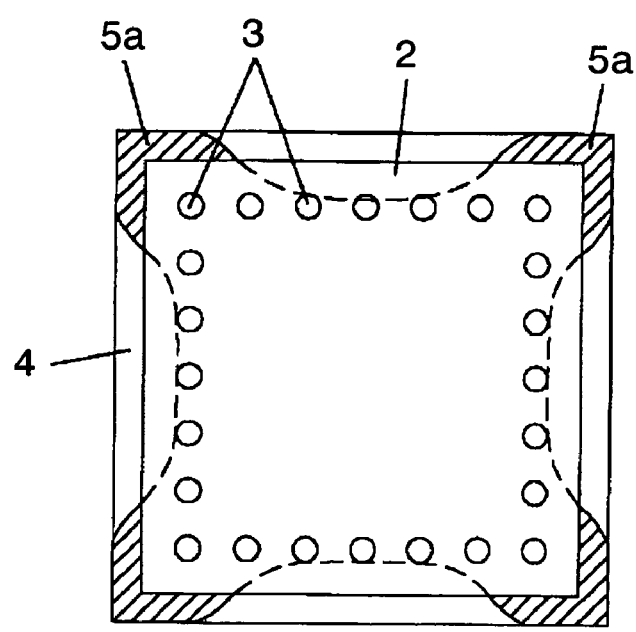
FIG. 8B is a plan view of the semiconductor device according to embodiment 1 of the invention.

Like semiconductor device 101 shown in FIGS. 8A and 8B, protrusion of resin binder 5a from a periphery portion of semiconductor element 2 is limited to a direction of diagonal line of semiconductor element 2, and thereby a reinforced portion where a side face of semiconductor element 2 is covered with resin binder 5a may be formed only at corners of semiconductor element 2. In this case, during coating of resin binder 5 with dispenser 7 in FIG. 2B, so as to coat resin binder 5 only in a range shown in FIG. 8B, a coating trajectory of dispenser 7 is set in an X-shape and a discharge amount from dispenser 7 is controlled. When a formation range of the reinforcement portion is thus limited to corner portions of semiconductor element 2, the corner portions that are most likely to be damaged in a mounting state after completion of the semiconductor device can be selectively reinforced.

Embodiment 2

Embodiment 2 will be explained with reference to FIGS. 9A through 9D.

According to the present embodiment 2, in a first step of supplying a resin binder to a plate member, without using a dispenser, a resin binder formed beforehand in a sheet is adhered to the plate member.

Figure 9A:
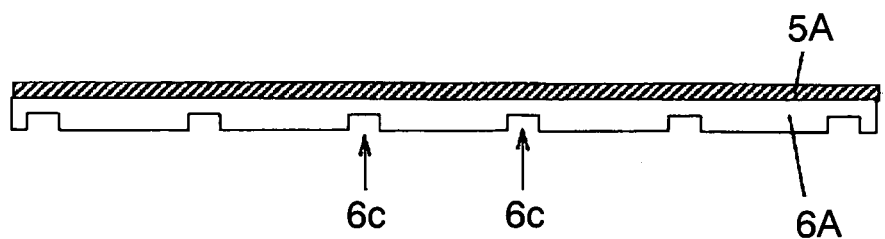
FIGS. 9A through 9D are diagrams for explaining steps of an assembling method of a semiconductor device according to embodiment 2 of the invention.

In FIG. 9A, plate member 6A has a shape in which raised partitions 6a on a top surface of plate member 6 shown in embodiment 1 are removed, and on a bottom surface of plate member 6A similar grooves 6c are formed. On a top surface of plate member 6A, resin sheet 5A is adhered. Resin sheet 5A is one obtained by forming a resin material similar to resin binder 5 used in embodiment 1 in a sheet and is adhered to plate member 6A owing to adhesiveness of resin binder 5 itself.

Figure 9B:
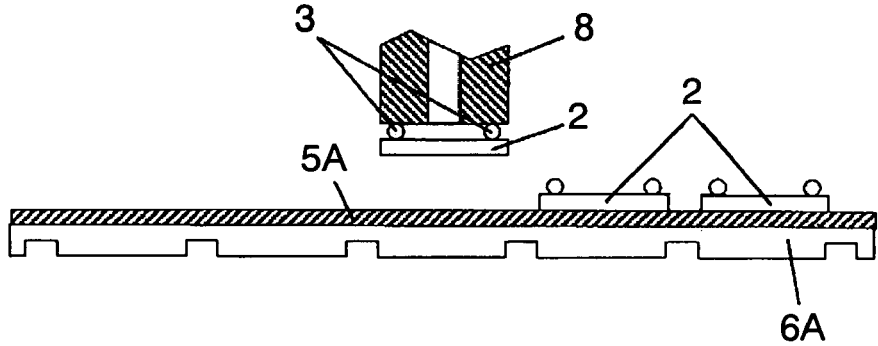
Figure 9C:
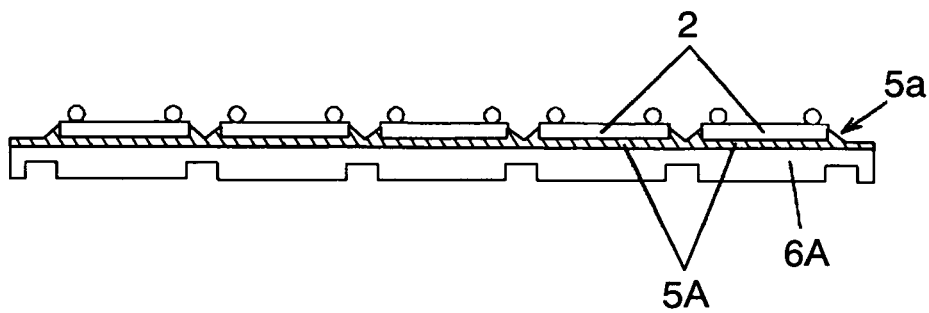
Figure 9D:
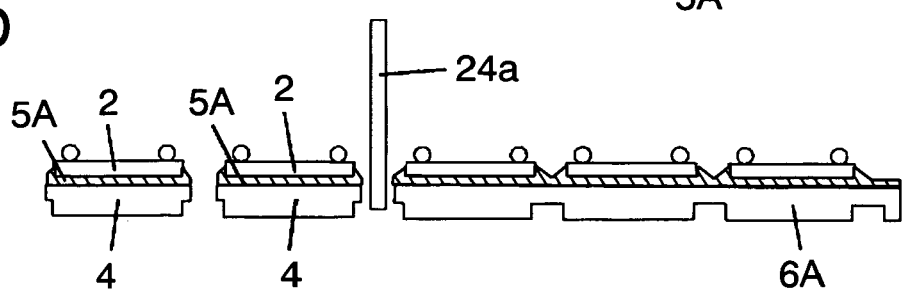

Thereafter, plate member 6 to which resin sheet 5A is adhered is sent to a second step for adhering semiconductor elements. In the second step, as shown in FIGS. 9B and 9C, a second surface of semiconductor element 2 is mounted on resin sheet 5A that is adhered to plate member 6 (mounting step), followed by heating resin sheet 5A (heating step) to cure a resin component of resin sheet 5A. Thereby, second surface (rear surface) sides of a plurality of semiconductor elements 2 are adhered through cured resin sheet 5A to plate member 6 in an arranged state.

In the heating step, the heating at a predetermined temperature by use of a heating furnace enables curing of the resin component in resin sheet 5A. At this time, resin binder 5 located outside of a periphery portion of respective semiconductor elements 2 becomes temporarily lower in viscosity in the course of curing to increase the fluidity, and thereby creeps up side face 2b of semiconductor element 2 owing to surface tension. When the heating is further continued, the resin component of resin sheet 5A is cured with side face 2b covered. Thereby, after the curing of resin sheet 5A, resin binder 5a is formed as a reinforcement as shown in FIG. 1B. Thereby, the second step is completed.

Plate member 6A with resin sheet 5A completely cured is transferred to a cutting step, and here plate member 6A to which semiconductor elements 2 are adhered is cut between adjacent semiconductor elements 2 (third step). Thereby, plate member 6A is cut and separated into plates 4 for individual semiconductor elements 2, and thereby assembly of semiconductor device 1 is completed.

Embodiment 3

A semiconductor device according to embodiment 3 will be explained with reference to FIGS. 10A and 10B.

Figure 10A:
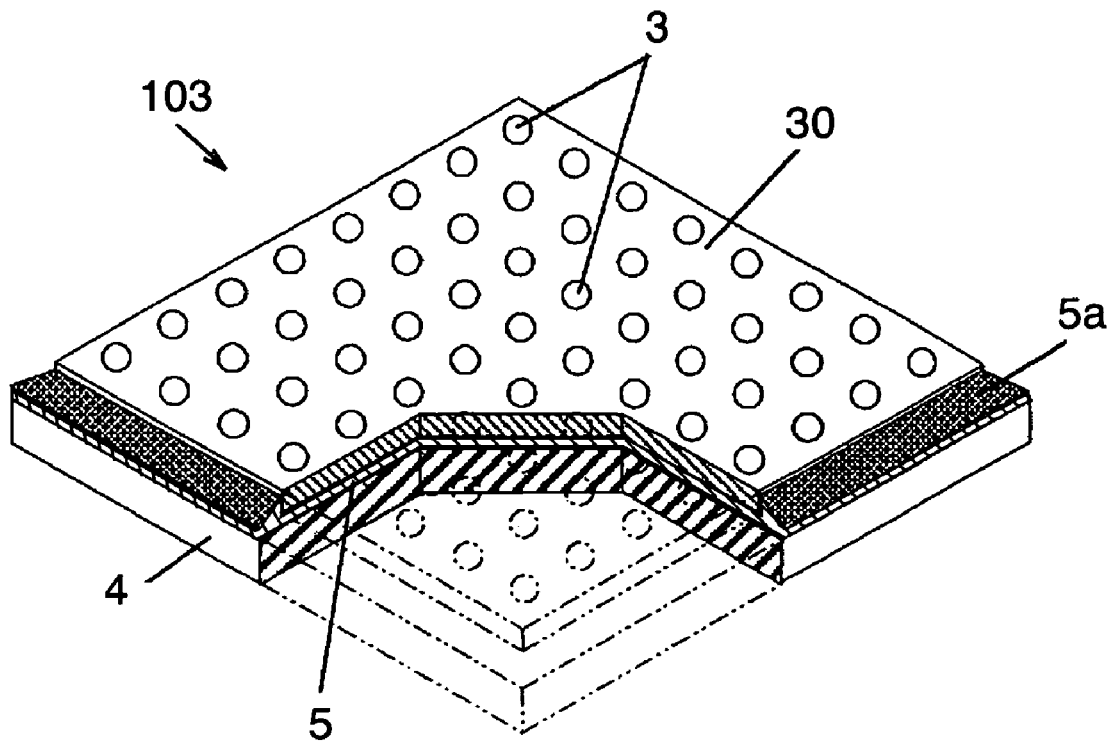
FIG. 10A is a perspective view of a semiconductor device according to embodiment 3 of the invention.
Figure 10B:
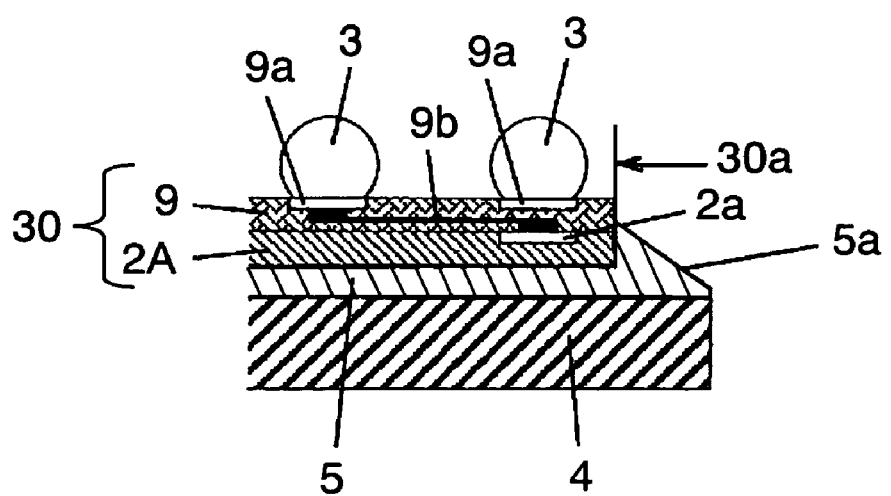
FIG. 10B is a partial sectional view of the semiconductor device according to embodiment 3 of the invention.
Figure 11A:
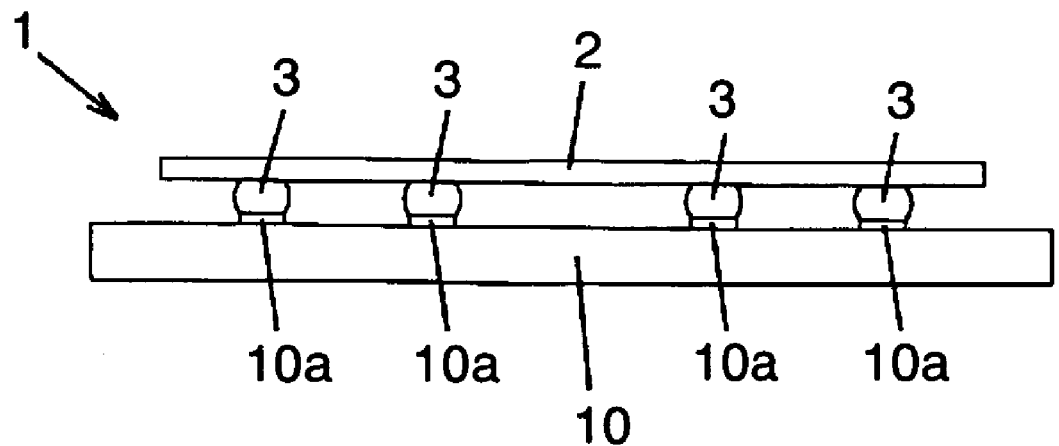
FIG. 11A is a sectional view of an existing mounting structure.
Figure 11B:
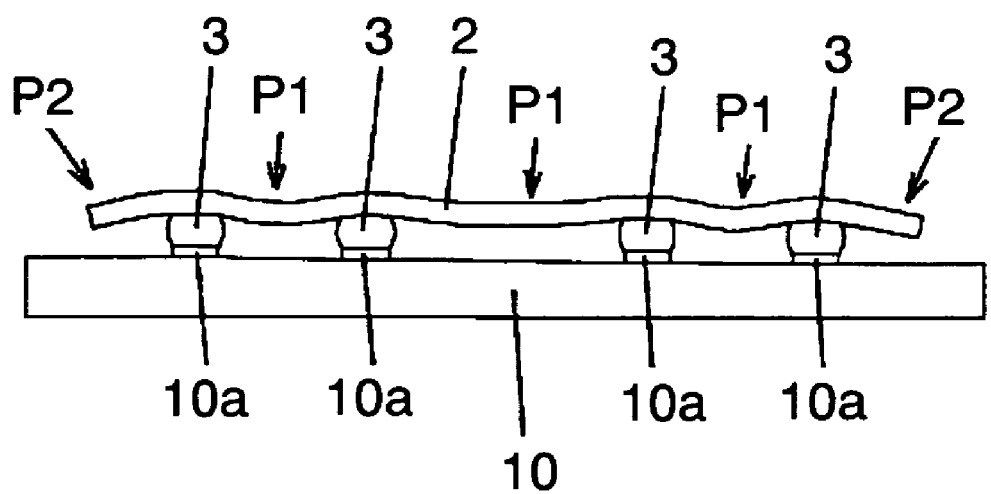
FIG. 11B is a diagram showing a deformation state of a semiconductor device in the existing mounting structure.

In FIG. 10A, semiconductor device 103 is formed by adhering plate 4 (integrated body) to a rear surface (that is, second surface) of semiconductor element 30 with resin binder 5, and on a surface of semiconductor element 30 a plurality of bumps 3 is formed in a lattice pattern. As shown in FIG. 10B, semiconductor element 30 is formed by forming re-wiring layer 9 on a top surface (electrode formation surface) of semiconductor element 2A that is thinned similarly to semiconductor element 2 shown in embodiment 1.

At a periphery of a surface (that is, first surface) of semiconductor element 2A, electrodes 2a that are external connection terminals are formed, and the respective electrodes 2a are in conduction with electrodes 9a formed in the number corresponding to that of electrodes 2a on a surface of re-wiring layer 9 through internal wiring 9b inside a re-wiring layer 9. On electrode 9a, bump 3 is formed for mounting semiconductor device 103.

In embodiment 3, by disposing re-wiring layer 9, in comparison with semiconductor device 1 shown in embodiment 1, more bumps 3 can be formed in the same projected area, that is, denser mounting is made possible. In order to assemble the semiconductor device 103, in methods of assembling semiconductor devices shown in embodiments 1 and 2, semiconductor element 2 has only to be replaced by semiconductor element 30.

Thereby, on side face 30a of semiconductor element 30, a reinforcement portion is formed by protruded resin binder 5a covering side face 30a. In semiconductor device 103 thus configured, by forming the reinforcement portion where side face 30a of semiconductor element 30 is covered, as mentioned above, the flexural deformation generated at a periphery portion of semiconductor element 30 after mounting is inhibited from occurring, and thereby internal wiring 9b inside rewiring-layer 9 can be inhibited from being disconnected.

In the above-explained embodiments, when commercially available epoxy resin, acrylic resin, urethane resin and silicone resin are used as the resin, a similar effect can be obtained. However, the present invention is not restricted to these resins.

INDUSTRIAL APPLICABILITY

A semiconductor device according to the present invention has a configuration where an outer shape of an integrated body that is adhered through a resin binder to a semiconductor device is made larger than that of the semiconductor device, and the resin binder is made so as to cover a side face of the semiconductor element to form a reinforcement portion for reinforcing a periphery of the semiconductor element. Accordingly, the semiconductor element can inhibit damage from occurring in the neighborhood of an outer periphery, and thereby the reliability after mounting can be secured.

Furthermore, an assembling method includes a step of supplying a resin binder to a plate member that is an integrated body, a step of adhering rear surface sides of the semiconductor elements to the plate member in an arranged manner, and a step of cutting the plate member to which the semiconductor elements are adhered between adjacent semiconductor elements. Thereby, a semiconductor device in which a thinned semiconductor element is adhered to an integrated body can be easily and efficiently assembled.

The invention claimed is:

1. A semiconductor device comprising:
a semiconductor element that has a first surface on which an external connection terminal is formed and a second surface opposite the first surface, and a thickness of 10 μm or more and 150 μm or less;
a plate that faces the second surface; and
a resin binder that adheres the second surface and the plate,
wherein the plate has a rigidity higher than that of the semiconductor element;
wherein the second surface of the semiconductor element comprises a surface-finished surface such that the second surface of the semiconductor element is free from having a damaged layer thereon;
wherein an outer shape of the plate is larger than that of the semiconductor element; and
wherein the resin binder covers a peripheral side face of the semiconductor element, and furthermore at a portion that is interposed between the second surface and the plate the resin binder allows the semiconductor element to deform in a thickness direction thereof.

2. The semiconductor device according to claim 1, wherein the resin binder covers at least an edge defined by a side face and the second surface of the semiconductor element, about the outer periphery of the semiconductor element.

3. The semiconductor device according to claim 1, wherein the resin binder covers the side face over an entire circumference of the semiconductor element.

4. The semiconductor device according to claim 1, wherein the resin binder covers only a corner of the side face of the semiconductor element.

5. The semiconductor device according to claim 1, wherein the external connection terminal is provided with a bump.

6. The semiconductor device according to claim 1, wherein the semiconductor element includes a re-wiring layer on the first surface, the re-wiring layer has a surface electrode formed on a surface and an internal electrode formed inside thereof, and the internal electrode connects the surface electrode and the external connection terminal.

7. The semiconductor device according to claim 6, wherein the surface electrode is provided with a bump.

8. The semiconductor device according to claim 1, wherein a surface of the peripheral side face of the semiconductor element includes a micro crack, and the resin binder covering the peripheral side face of the semiconductor element reinforces the peripheral side face having the micro crack.

9. The semiconductor device according to claim 1, wherein the first surface of the semiconductor element is exposed from the resin binder.

10. A semiconductor device assembling method in which a semiconductor element and a plate that is higher in rigidity than the semiconductor element are adhered via a resin binder, the semiconductor element having a first surface on which an external connection terminal is formed and a second surface opposite the first surface, the second surface being adhered to the plate, said method comprising:
roughly processing by mechanically polishing a side opposite to the first surface on which an external connection terminal of the semiconductor element is formed, followed by further applying finishing to obtain a second surface from which a damaged layer is removed and to make a thickness of the semiconductor element 10 μm or more and 150 μm or less;
supplying the resin binder to a plate member including the plate;
adhering the second surface and the plate in an aligned state by use of the resin binder; and
cutting the plate from the plate member.

11. The semiconductor device assembling method according to claim 10, wherein, in said adhering, the resin binder is formed to cover an outer periphery of the semiconductor element.

12. The semiconductor device assembling method according to claim 11, wherein, in said adhering, the resin binder is spread to a side face of the semiconductor element to cover the outer periphery by decreasing the viscosity of the resin binder by heating.

13. The semiconductor device assembling method according to claim 10, wherein said supplying comprises supplying the resin binder by an amount necessary to cover a side face of the semiconductor element.

14. The semiconductor device assembling method according to claim 10, wherein, in said supplying, the resin binder supplied is liquid resin, the plate member has a projection surrounding the plate, and the liquid resin is supplied inside of the projection.

15. The semiconductor device assembling method according to claim 10, wherein, in said supplying, the resin binder is supplied as a resin binder sheet, and the resin binder sheet is adhered to the plate member.

16. The semiconductor device assembling method according to claim 10, wherein said plate constitutes one of a plurality of plates;
said semiconductor element constitutes one of a plurality of semiconductor elements; and
said adhering includes mounting the semiconductor elements via the resin binder for each of the plates of the plate member, and heating the plate member on which the semiconductor elements are mounted.

17. The semiconductor device assembling method according to claim 16, wherein, in said adhering, said mounting and said heating are carried out simultaneously.

18. The semiconductor device assembling method according to claim 17, wherein said adhering is carried out by use of a semiconductor element mounting device that includes a heating device.

19. The semiconductor device assembling method according to claim 10, wherein the semiconductor element has a re-wiring layer on the first surface.

* * * * *